(12) United States Patent
Crowder et al.

(10) Patent No.: US 10,032,957 B2
(45) Date of Patent: Jul. 24, 2018

(54) SUBSTRATE WITH TOPOLOGICAL FEATURES FOR STEERING FLUIDIC ASSEMBLY LED DISKS

(71) Applicant: Sharp Laboratories of America, Inc., Camas, WA (US)

(72) Inventors: Mark Albert Crowder, Portland, OR (US); Paul J. Schuele, Washougal, WA (US); Changqing Zhan, Vancouver, WA (US); Kenji Alexander Sasaki, West Linn, OR (US); Kurt Michael Ulmer, Vancouver, WA (US)

(73) Assignee: eLux Inc., Vancouver, WA (US)

( * ) Notice: Subject to any disclaimer, the term of this patent is extended or adjusted under 35 U.S.C. 154(b) by 0 days.

(21) Appl. No.: 15/682,260

(22) Filed: Aug. 21, 2017

(65) Prior Publication Data

US 2018/0033915 A1 Feb. 1, 2018

Related U.S. Application Data

(63) Continuation of application No. 15/221,571, filed on Jul. 27, 2016, now Pat. No. 9,755,110.

(51) Int. Cl.
*H01L 33/62* (2010.01)
*H01L 33/24* (2010.01)
*H01L 27/15* (2006.01)

(52) U.S. Cl.
CPC ............ *H01L 33/24* (2013.01); *H01L 27/156* (2013.01); *H01L 33/62* (2013.01); *H01L 2933/0066* (2013.01)

(58) Field of Classification Search
None
See application file for complete search history.

(56) References Cited

U.S. PATENT DOCUMENTS

| 7,906,794 | B2 * | 3/2011 | Harrah | H01L 33/56 257/100 |
|---|---|---|---|---|
| 2004/0097161 | A1 * | 5/2004 | Gourlay | H01L 21/563 445/24 |
| 2007/0031992 | A1 * | 2/2007 | Schatz | G06K 19/07718 438/107 |
| 2014/0355931 | A1 * | 12/2014 | Tummala | G02B 6/43 385/14 |
| 2015/0214430 | A1 * | 7/2015 | Zhan | H01L 33/20 257/13 |
| 2017/0133558 | A1 * | 5/2017 | Sasaki | H01L 33/486 |
| 2017/0338379 | A1 * | 11/2017 | Zhan | H01L 25/0753 |

* cited by examiner

Primary Examiner — Bilkis Jahan
(74) Attorney, Agent, or Firm — Hamilton, DeSanctis & Cha (57) ABSTRACT

Embodiments are related to integrated circuit (IC) fabrication and, more particularly, to a fluidic assembly process for the placement of light emitting diodes on a direct-emission display substrate.

7 Claims, 8 Drawing Sheets

SUBSTRATE WITH TOPOLOGICAL FEATURES FOR STEERING FLUIDIC ASSEMBLY LED DISKS

RELATED APPLICATIONS

This application is a continuation of an application entitled, SUBSTRATE WITH TOPOLOGICAL FEATURES FOR STEERING FLUIDIC ASSEMBLY LED DISKSFLUIDIC ASSEMBLY TOP-CONTACT LED DISK", invented by Mark Albert Crowder et al., U.S. patent application Ser. No. 15/221,571, filed Jul. 27, 2016. The entirety of the aforementioned application is incorporated herein for all purposes.

FIELD OF THE INVENTION

Embodiments are related to integrated circuit (IC) fabrication and, more particularly, to a fluidic assembly process for the placement of light emitting diodes on a direct-emission display substrate.

BACKGROUND

LED displays, LED display components, and arrayed LED devices include a large number of diodes formed or placed at defined locations across the surface of the display or device. Fluidic assembly may be used for assembling diodes in relation to a substrate for use in manufacturing LED devices. Such assembly is often a stochastic process whereby LED devices are deposited into wells on a substrate. By its nature, such a stochastic process is unpredictable leading to uncontrollable assembly.

Hence, for at least the aforementioned reasons, there exists a need in the art for advanced systems and methods for manufacturing LED displays, LED display components, and LED devices.

SUMMARY

Embodiments are related to integrated circuit (IC) fabrication and, more particularly, to a fluidic assembly process for the placement of light emitting diodes on a direct-emission display substrate.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Embodiments are related to integrated circuit (IC) fabrication and, more particularly, to a fluidic assembly process for the placement of light emitting diodes on a direct-emission display substrate.

Some embodiments provide fluidic assembly direct-emission display panels that include: a substrate, a first film, and a second film. The substrate includes a planar top surface and interconnect pads aligned in a plurality of rows. The first film is disposed over the top surface of the substrate and includes a plurality of wells, where each of the plurality of wells expose corresponding ones of the interconnect pads. The second film is disposed over the first film, wherein the second film includes at least one steering feature surrounding two or more of the plurality of wells.

In some instances of the aforementioned embodiments, the steering feature is a slot with a cross-section greater than an opening of each of the two or more of the plurality of wells. In some such instances, the two or more of the plurality of wells is part of a column of wells. In various instances of the aforementioned embodiments, the second film is a removable material. In one or more instances of the aforementioned embodiments, the two or more of the plurality of wells each have a perimeter. The steering feature in the second film has a sidewall having through-indentations coextensive with at least a portion of the perimeter of each of the two or more of the plurality of wells. In various instances of the aforementioned embodiments, the substrate further includes a plurality of bottom electrically conductive traces, with each bottom conductive trace associated with a corresponding one of the plurality of rows.

In various instances of the aforementioned embodiments, the substrate further includes a plurality of bottom electrically conductive traces, with each bottom electrically conductive trace being associated with a corresponding one of the plurality of rows. In some such instances, a light emitting diode (LED) disk is situated in each of the two or more of the plurality of wells. The LED disk has a cross-sectional width less than a cross-sectional opening of each of the two or more of the plurality of wells, and a bottom surface with a lower contact to make an electrical connection with one of the interconnect pads. In some cases, the first film has a thickness and the LED disks have about the same thickness. The panel further includes: an insulator material filling each steering feature, with vias exposing a top contact of each of the LED disks; and a plurality of top electrically conductive traces, with each top conductive trace connected to a top contact of each of the LED disks in a corresponding column of wells.

In one or more instances of the aforementioned embodiments, the substrate includes a through-hole via (THV) co-located with each of the interconnect pads. In some cases, the substrate includes a through-hole via (THV) co-located with each of the interconnect pads, and a cross-sectional opening of the THV is less than a width of each of the LED disks.

Other embodiments provide methods for forming a fluidic assembly direct-emission display panel. The methods include: providing a substrate with a planar top surface and interconnect pads aligned in a plurality of parallel rows; forming a first film overlying the substrate top surface; forming a plurality of wells in the first film, each well having a cross-sectional opening, and aligned in a corresponding row and column, exposing a corresponding interconnect pad; forming a second film overlying the first film; and forming a plurality of parallel slots in the second film, where each slot has a width greater than the well cross-sectional opening, exposing a corresponding column of wells.

In some instances of the aforementioned embodiments, forming the wells in the first film includes forming wells with a perimeter; and forming the slots in the second film includes forming through-indentations in a sidewall of each slot, with the through-indentations exposing at least a portion of each well perimeter. In various instances of the aforementioned embodiments, the methods further include: flowing a suspension comprising a carrier fluid and a plurality of light emitting diode (LED) disks, where each LED disk has a disk diameter less than the well cross-sectional opening, and a bottom surface with a lower contact; channeling the ink into the plurality of slots; capturing the LED disks in the wells; and making contact between the lower contact of each LED disk and a corresponding bottom trace.

In one or more instances of the aforementioned embodiments, forming the first film includes forming the first film with a first thickness; where flowing the suspension includes flowing a suspension including LED disks having about the first thickness. In such instances, the methods further include: subsequent to capturing the LED disks in the wells, forming an insulating material to isolate LED disk sidewalls from subsequently formed top conductive traces, with vias exposing LED disk top contacts; and forming a plurality of top electrically conductive traces overlying the insulator material and connected the top contact of a column of LED disks. In particular instances of the aforementioned embodiments, the methods further include removing the second film subsequent to capturing the LED disks in the wells. In one or more instances of the aforementioned embodiments, the methods further include forming through-hole vias (THVs) co-located with each interconnect pad prior to forming the first film. In various instances of the aforementioned embodiments, the methods further include: forming through-hole vias (THVs) co-located with each interconnect pad, each THV having a THV diameter less than the LED disk diameter prior to forming the first film; and simultaneous with flowing the ink, creating vacuum pressure through the THVs. In such instances, capturing the LED disks in the wells includes capturing the LED disks at least partially in response to the vacuum pressure Turning to FIG. 1, a fluidic assembly system 100 is shown that is capable of moving a suspension 110 composed of a carrier liquid 115 and a plurality of diode objects 130 relative to the surface of a substrate 140 including wells 142 in accordance with one or more embodiments of the present inventions. In some cases, the depth of wells 142 is substantially equal to the height of diode objects 130, and the inlet opening of wells 142 is greater that the width of diode objects 130 such that only one diode object 130 deposits into any given well 142. It should be noted that while embodiments discuss depositing diode objects 130 into wells 142, that other devices or objects may be deposited in accordance with different embodiments of the present inventions.

Figure 1:
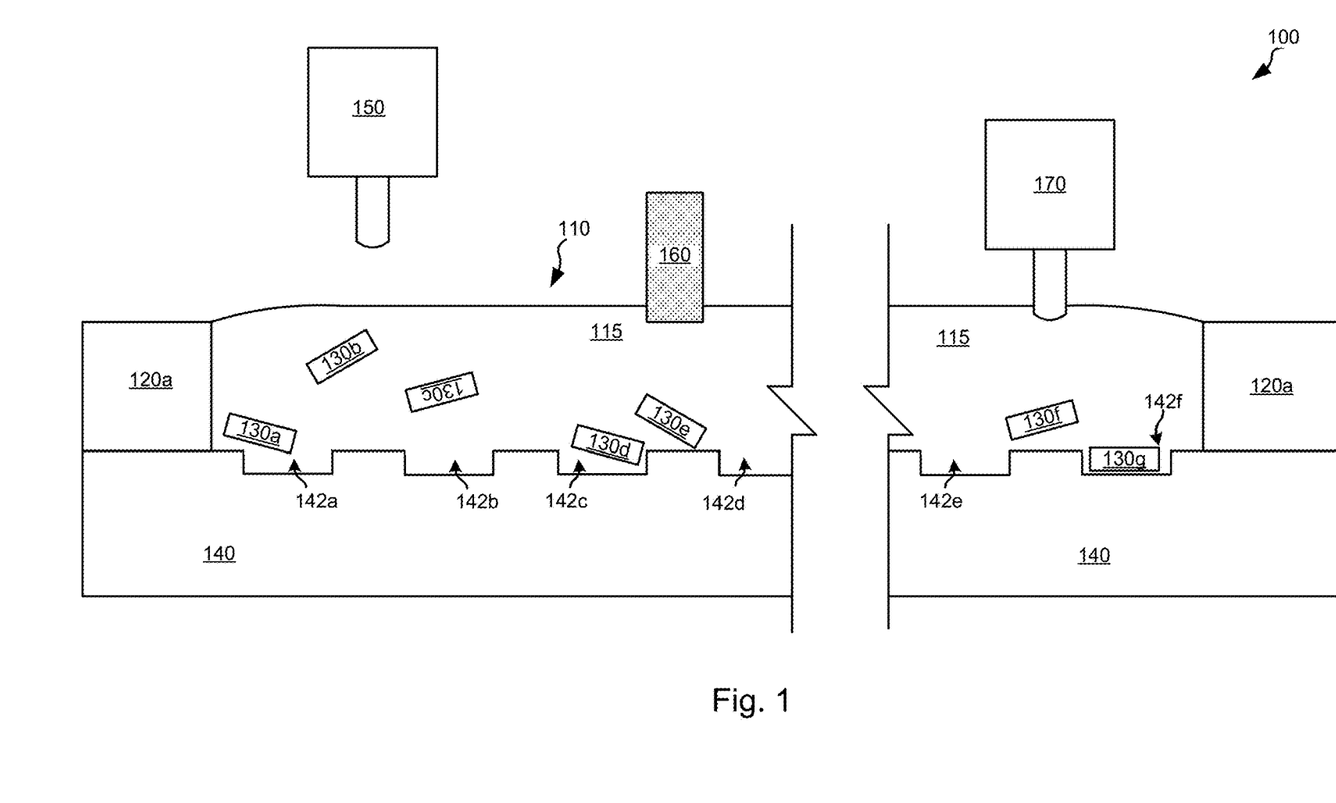
FIG. 1 depicts a fluidic assembly system capable of moving a suspension composed of a carrier liquid and a plurality of diode objects relative to the surface of a substrate including in accordance with one or more embodiments of the present inventions.

A depositing device 150 deposits suspension 110 over the surface of substrate 140 with suspension 110 held on top of substrate 140 by sides 120 of a dam structure. In some embodiments, depositing device 150 is a pump with access to a reservoir of suspension 110. A suspension movement device 160 agitates suspension 110 deposited on substrate 140 such that diode objects 130 move relative to the surface of substrate 140. As diode objects 130 move relative to the surface of substrate 140 they deposit into wells 142 in either a non-inverted orientation or an inverted orientation. In some embodiments, suspension movement device 160 is a brush that moves in three dimensions. Based upon the disclosure provided herein, one of ordinary skill in the art will recognize a variety of devices that may be used to perform the function of suspension movement device 160 including, but not limited to, a pump.

A capture device 170 includes an inlet extending into suspension 110 and capable of recovering a portion of suspension 110 including a portion of carrier liquid 115 and non-deposited diode objects 130, and returning the recovered material for reuse. In some embodiments, capture device 170 is a pump. In some cases, substrate 140 may be implemented similar to one of the substrates discussed below in relation to FIGS. 2-5. Further, in some cases, substrate 140 may be formed using one or more processes discussed below in relation to FIGS. 6-7.

Figure 2A:
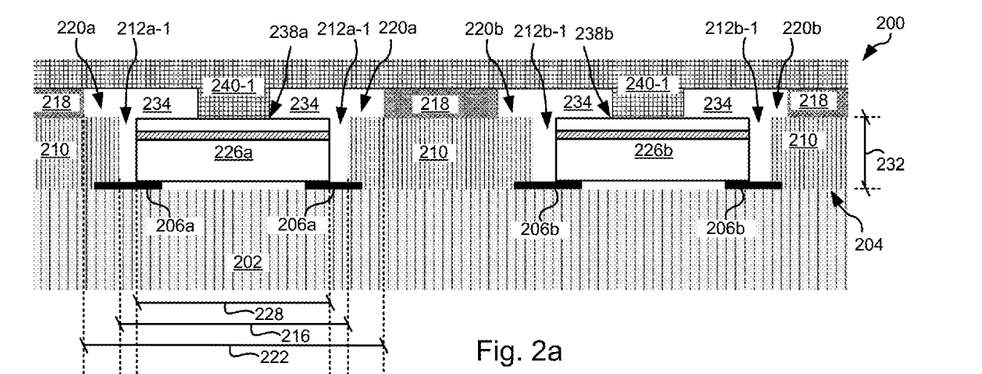
FIGS. 2a-2c show a portion of a panel including wells into which diode objects are deposited and steering structures in accordance with various embodiments of the present inventions.
Figure 2B:
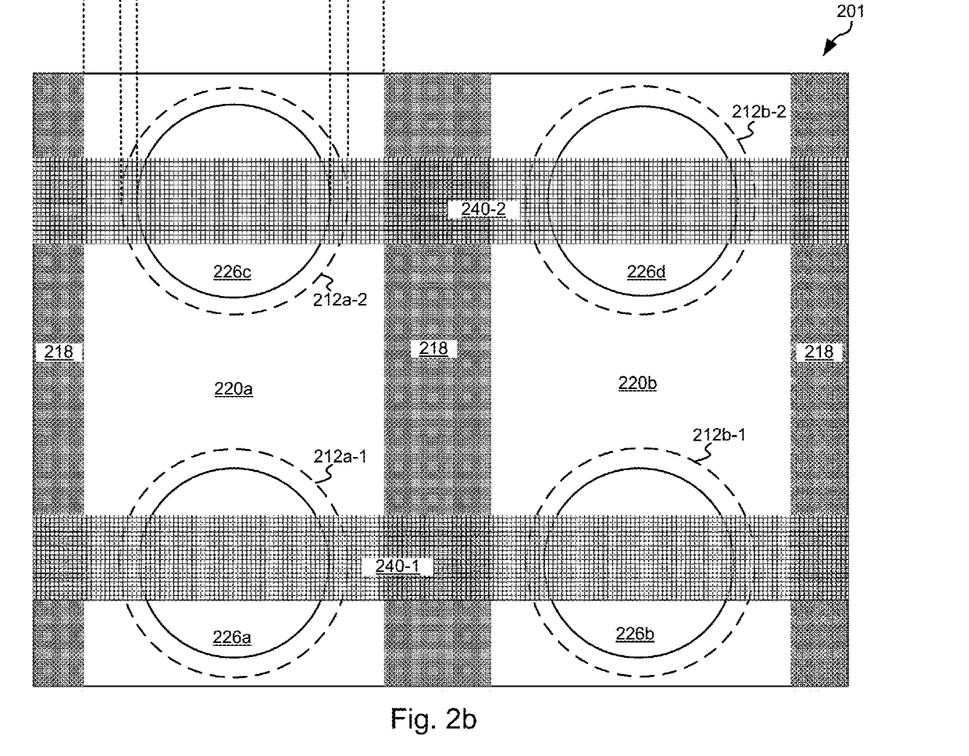

Turning to FIGS. 2a-2b, a cross-sectional view 200 and a top view 201 of a portion of a panel including wells 212 into which diode objects 226 (e.g., Light Emitting Diodes) are deposited and steering structures 220 is shown in accordance with various embodiments of the present inventions. As shown, the panel includes a substrate 202 with a planar top surface 204 and interconnect pads 206 aligned in a plurality of rows. Substrate 202 may be a transparent material such as glass, quartz, or a plastic. While FIGS. 2a-2b show only two columns and two rows incorporating four wells 212, a number of rows (indicated by the small case letter following the element identifying numbers (e.g., 220a, where the "a" indicates the row)) and columns (indicated by the dash number following the element identifying numbers (e.g., 240-1, where the "'1" indicates the column)) can be used to form a panel. In some embodiments, a thickness of substrate 202 measured form a bottom surface to top surface 204 is three hundred (300) microns. Based upon the disclosure provided herein, one of ordinary skill in the art will appreciate other thicknesses that may be used for substrate 202 in accordance with different embodiments.

A first film 210 is disposed over top surface 204 of substrate 202, and wells 212 are defined in first film 210.

Being disposed over may include being formed directly on substrate 202 or atop one or more layers which themselves overly substrate 202. Each well 212 is aligned in a corresponding row (again, indicated by the small case letter following the element identifying numbers) and column (again, indicated by the dash number following the element identifying numbers). Each well 212 has a cross-sectional opening 216 that exposes a corresponding interconnect pad 206. As one particular example, well 212a-1 exposes interconnected pad 206a. In this embodiment, cross-sectional opening 216 is depicted as circular, but alternatively it may be square, rectangular, oval, or have a counterbore pocket structure. Such a counterbore pocket structure may be similar to that disclosed in U.S. patent application Ser. No. 14/530,230, entitled "COUNTERBORE POCKET STRUCTURE FOR FLUIDIC ASSEMBLY", and filed Oct. 31, 2014. The entirety of the aforementioned reference is incorporated herein by reference for all purposes. First film 210 may be formed using any process known in the art for forming a layer with wells. As just one example, first film 210 may be formed using a conformal deposition and selective etching process. Based upon the disclosure provided herein, one of ordinary skill in the art will recognize a variety of processes that may be used to form first film 210 in accordance with different embodiments. In some embodiments, wells 212 are set off from each other by five hundred (500) microns (i.e., $10^{-6}$ m) (i.e., from a center of one well to the center of the next well in both the X and Y directions). Based upon the disclosure provided herein, one of ordinary skill in the art will appreciate other distances at which wells 212 may be offset from one another in accordance with different embodiments. In some embodiments, cross-sectional opening 216 of wells 212 is sixty (60) microns. Based upon the disclosure provided herein, one of ordinary skill in the art will appreciate other cross-sectional widths that may be used for wells 212 in accordance with different embodiments.

A second film 218 is disposed over first film 210. Being disposed over may include being formed directly on first film 210 or atop one or more layers which themselves overly first film 210. Second film 218 includes plurality of parallel steering structures 220. Each steering structure 220 has a width 222 that is greater than cross-sectional opening 216 of wells 212 and surrounds a number of wells (e.g., steering structure 220a surrounds wells 212a-1 and 212a-2; and steering structure 220b surrounds wells 212b-1 and 212b-2) such that the surrounded wells are exposed within the respective steering structure 220. In some embodiments, cross-sectional opening 222 of steering structures 220 is between seventy-five (75) and one hundred fifty (150) microns. Based upon the disclosure provided herein, one of ordinary skill in the art will appreciate other cross-sectional widths that may be used for steering structures 220 in accordance with different embodiments. In various embodiments, the depth of steering structures measured form the bottom of wells 212 is between five hundred (500) and seven hundred (700) microns. Based upon the disclosure provided herein, one of ordinary skill in the art will appreciate other depths that may be used for steering structures 220 in accordance with different embodiments.

In some embodiments, second film 218 is a removable material that can be removed prior to deploying the final assembled panel. In other embodiments, second film 218 is not removed prior to deploying the final assembled panel. In some embodiments, second film 218 is a different material than that of first film 210. In other embodiments, second film 218 is the same material as that of first film 210. An example material for second film 218 is a positive photoresist, as this would permit photolithographic patterning and fluidic assembly with a water or isopropanol suspension, and it can be rinsed away after the process with acetone or ethyl lactate, neither of which would affect the polyimide laminate. In this embodiment, wells 212 are approximately centered within their respective steering structure 220 (i.e., wells 212 are located approximately equal distant from each wall of their respective steering structure 220). However, as described in other examples below, that condition is not a necessity. Second film 218 may be formed using any process known in the art for forming a layer with steering structures. As one example, second film 218 may be formed by applying the material of second film 218, and lithographically patterning and etching to form steering structures 220 aligned to wells 212. Based upon the disclosure provided herein, one of ordinary skill in the art will recognize a variety of processes that may be used to form second film 218 in accordance with different embodiments.

Diode objects 226 are deposited into wells such that a bottom contact on each of diode objects are electrically connected to interconnect pads 206 exposed by wells 212. A plurality of top electrically conductive traces 240 are disposed over a column of wells 212 such that an electrical connection at a top contact 238 of each of the diode objects 226 within a given column is made. An insulator material 234 is formed around each of the diode objects 226 within their respective well 212. As would be known in the art, diode objects 226 may include a lower material with either a p-dopant or an n-dopant and an upper material of the opposite dopant type, with an intervening multiple quantum well (MQW). The MQW may be a series of quantum well shells (typically 5 layers—e.g., alternating 5 nanometer (nm) of indium gallium nitride (InGaN) with 9 nm of n-doped GaN (n-GaN)). There may also be an aluminum gallium nitride (AlGaN) electron blocking layer between MQW layers and the p-doped disk. The outer shell may be p-doped GaN (Mg doping) about 200 nm thick. A high-brightness blue LED can be formed, or a green LED if a higher indium content is used in the MQW. The lower material may be a material such as p-GaN, p-doped aluminum gallium indium phosphide (p-AlGaInP), n-GaN, or n-AlGaInP. The upper material may be the same as the lower material, but oppositely doped. It should be noted that the aforementioned discussion of materials and structure of diode objects 226 is not exhaustive, and that one of ordinary skill in the art will recognize other materials and structures that may be used in relation to different embodiments.

In some embodiments, first film 210 has a thickness 232 and diode objects 226 exhibit a similar thickness. In some cases, the difference between the thickness of diode object 226 and thickness 232 is less than fifty (50) percent of the overall thickness of diode object 226. In some embodiments, thickness 232 is five (5) microns. Based upon the disclosure provided herein, one of ordinary skill in the art will appreciate other thicknesses that may be used for first film 210 in accordance with different embodiments.

Figure 2C:
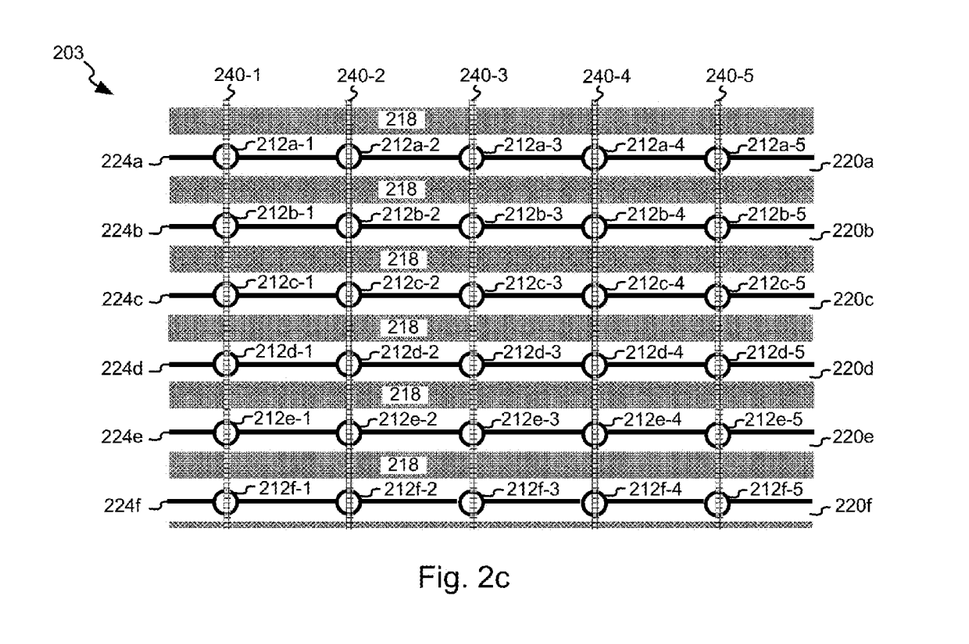

Turning to FIG. 2c, a top view 203 of a larger portion of the panel of FIGS. 2a-2b is depicted that includes more rows (i.e., "1" through "5") and columns (i.e., "a" through "f") than previously shown. It should be noted that panels in accordance with different embodiments may include a much larger number of rows and columns than what is depicted in FIG. 2c. As shown, substrate 202 further supports a plurality of bottom electrically conductive traces 224, with each bottom conductive trace associated with a corresponding row of wells 212 and interconnect pads 206. As a particular example, a bottom electrically conductive trace 224a is associated with a row "a" including wells 212a-1, 212a-2, 212a-3, 212a-4, 212a-5. Steering structures 220 encompass wells 212 (and thus, interconnect pads 206 exposed by the wells) in each row. As a particular example, in the "c" row, steering structure 220c encompasses wells 212c-1, 212c-2, 212c-3, 212c-4, 212c-5 (and the corresponding interconnect pads 206 exposed by the wells). Bottom electrically conductive traces 224 electrically connect interconnect pads 206 within a given row. Like interconnect pads 206, bottom electrically conductive traces 224 are disposed over substrate 202 and below first film 210. Interconnect pads 206 and bottom electrically conductive traces 224 may be formed using any process known in the art for forming an electrical contact layer. As just one example, interconnect pads 206 and bottom electrically conductive traces 224 may be formed using a conformal deposition and selective etching process. Based upon the disclosure provided herein, one of ordinary skill in the art will recognize a variety of processes that may be used to form interconnect pads 206 and bottom electrically conductive traces 224 in accordance with different embodiments.

In one aspect not shown, the wells are formed in the substrate, which is typically a glass or plastic material. In this aspect the second (i.e., slot forming) layer is more easily removed after fluidic assembly. In another aspect not shown, slots may be formed from multiple removable layers for steering disks during fluidic assembly, where the slots width of an overlying film is greater than the slot width of an underlying film.

Figure 3A:
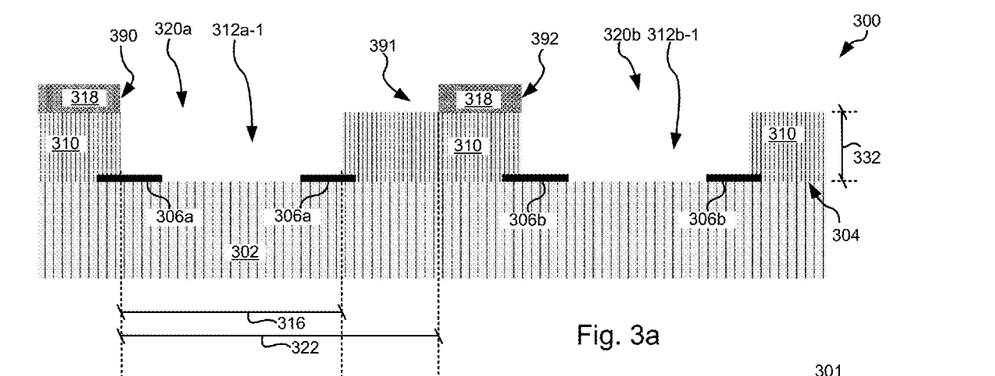
FIGS. 3a-3b show a portion of a panel including wells into which diode objects are deposited and off-center steering structures in accordance with some embodiments of the present inventions.
Figure 3B:
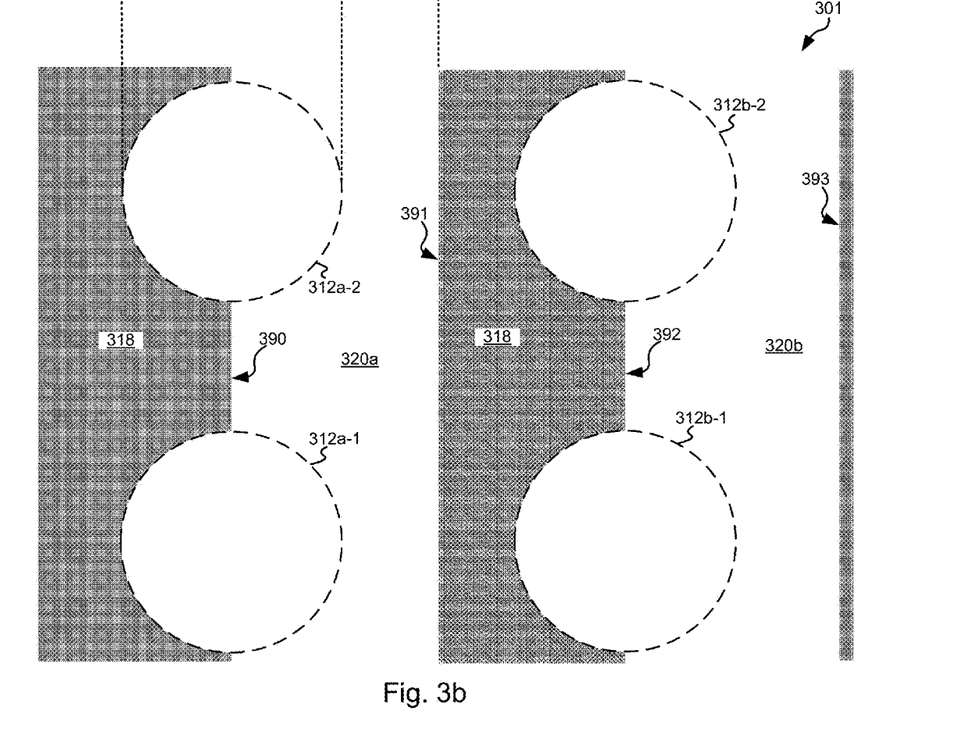

Turning to FIGS. 3a-3b, a cross-sectional view 300 and a top view 301 of a portion of a panel including wells 312 into which diode objects 326 (e.g., Light Emitting Diodes) are deposited and off-center steering structures 320 is shown in accordance with some embodiments of the present inventions. As shown, the panel includes a substrate 302 with a planar top surface 304 and interconnect pads 306 aligned in a plurality of rows. Substrate 302 may be a transparent material such as glass, quartz, or a plastic. While FIGS. 3a-3b show only two columns and two rows incorporating four wells 312, a number of rows (indicated by the small case letter following the element identifying numbers (e.g., 320a, where the "a" indicates the row)) and columns (indicated by the dash number following the element identifying numbers (e.g., 340-1, where the "1" indicates the column)) can be used to form a panel.

A first film 310 is disposed over top surface 304 of substrate 302, and wells 312 are defined in first film 310. Each well 312 is aligned in a corresponding row (again, indicated by the small case letter following the element identifying numbers) and column (again, indicated by the dash number following the element identifying numbers). Each well 312 has a cross-sectional opening 316 that exposes a corresponding interconnect pad 306. As one particular example, well 312a-1 exposes interconnected pad 306a. In this embodiment, cross-sectional opening 316 is depicted as circular, but alternatively it may be square, rectangular, oval, or have a counterbore pocket structure. First film 310 may be formed using any process known in the art for forming a layer with wells. As just one example, first film 310 may be formed using a conformal deposition and selective etching process. Based upon the disclosure provided herein, one of ordinary skill in the art will recognize a variety of processes that may be used to form first film 310 in accordance with different embodiments.

A second film 318 is disposed over first film 310. Second film 318 includes plurality of parallel steering structures 320. Each steering structure 320 has a width 322 that is greater than cross-sectional opening 316 of wells 312 and surrounds a number of wells (e.g., steering structure 320a surrounds wells 312a-1 and 312a-2; and steering structure 320b surrounds wells 312b-1 and 312b-2) such that the surrounded wells are exposed within the respective steering structure 320. In some embodiments, second film 318 is a removable material that can be removed prior to deploying the final assembled panel. In other embodiments, second film 318 is not removed prior to deploying the final assembled panel. In some embodiments, second film 318 is a different material than that of first film 310. In other embodiments, second film 318 is the same material as that of first film 310. In this embodiment, wells 312 off-center within steering structures 220 such that: a portion of the perimeters of wells 312a-1 and 312a-2 are coextensive with a sidewall 390 of second film 318, but a sidewall 391 of second film 318 is not coextensive with any portion of the perimeters of wells 312a-1 and 312a-2; and a portion of the perimeters of wells 312b-1 and 312b-2 are coextensive with a sidewall 392 of second film 318, but a sidewall 393 of second film 318 is not coextensive with any portion of the perimeters of wells 312b-1 and 312b-2. As shown, one sidewall of steering structure 320a (i.e., side wall 390) is coextensive with approximately half of the perimeter of each of wells 312a-1 and 312a-2, and one sidewall of steering structure 320b (i.e., side wall 392) is coextensive with approximately half of the perimeter of each of wells 312b-1 and 312b-2). In other embodiments, less than half of the perimeters of wells 312 are coextensive with one sidewall of steering structures 320. Second film 318 may be formed using any process known in the art for forming a layer with steering structures. As just one example, second film 318 may be formed using a conformal deposition and selective etching process. Based upon the disclosure provided herein, one of ordinary skill in the art will recognize a variety of processes that may be used to form second film 318 in accordance with different embodiments.

Diode objects 326 are deposited into wells such that a bottom contact on each of diode objects are electrically connected to interconnect pads 306 exposed by wells 312. A plurality of top electrically conductive traces 340 are disposed over a column of wells 312 such that an electrical connection at a top contact 338 of each of the diode objects 326 within a given column is made. An insulator material 334 is formed around each of the diode objects 326 within their respective well 312. As would be known in the art, diode objects 326 may include a lower material with either a p-dopant or an n-dopant and an upper material of the opposite dopant type, with an intervening multiple quantum well (MQW). The MQW may be a series of quantum well shells (typically 5 layers—e.g., alternating 5 nanometer (nm) of indium gallium nitride (InGaN) with 9 nm of n-doped GaN (n-GaN)). There may also be an aluminum gallium nitride (AlGaN) electron blocking layer between MQW layers and the p-doped disk. The outer shell may be p-doped GaN (Mg doping) about 300 nm thick. A high-brightness blue LED can be formed, or a green LED if a higher indium content is used in the MQW. The lower material may be a material such as p-GaN, p-doped aluminum gallium indium phosphide (p-AlGaInP), n-GaN, or n-AlGaInP. The upper material may be the same as the lower material, but oppositely doped. It should be noted that the aforementioned discussion of materials and structure of diode objects 326 is not exhaustive, and that one of ordinary skill in the art will recognize other materials and structures that may be used in relation to different embodiments.

In some embodiments, first film 310 has a first thickness 332 and diode objects 326 exhibit a similar thickness. In some cases, the difference between the thickness of diode object 326 and thickness 332 is less than fifty (50) percent of the overall thickness of diode object 326.

Figures 4A, 4B:
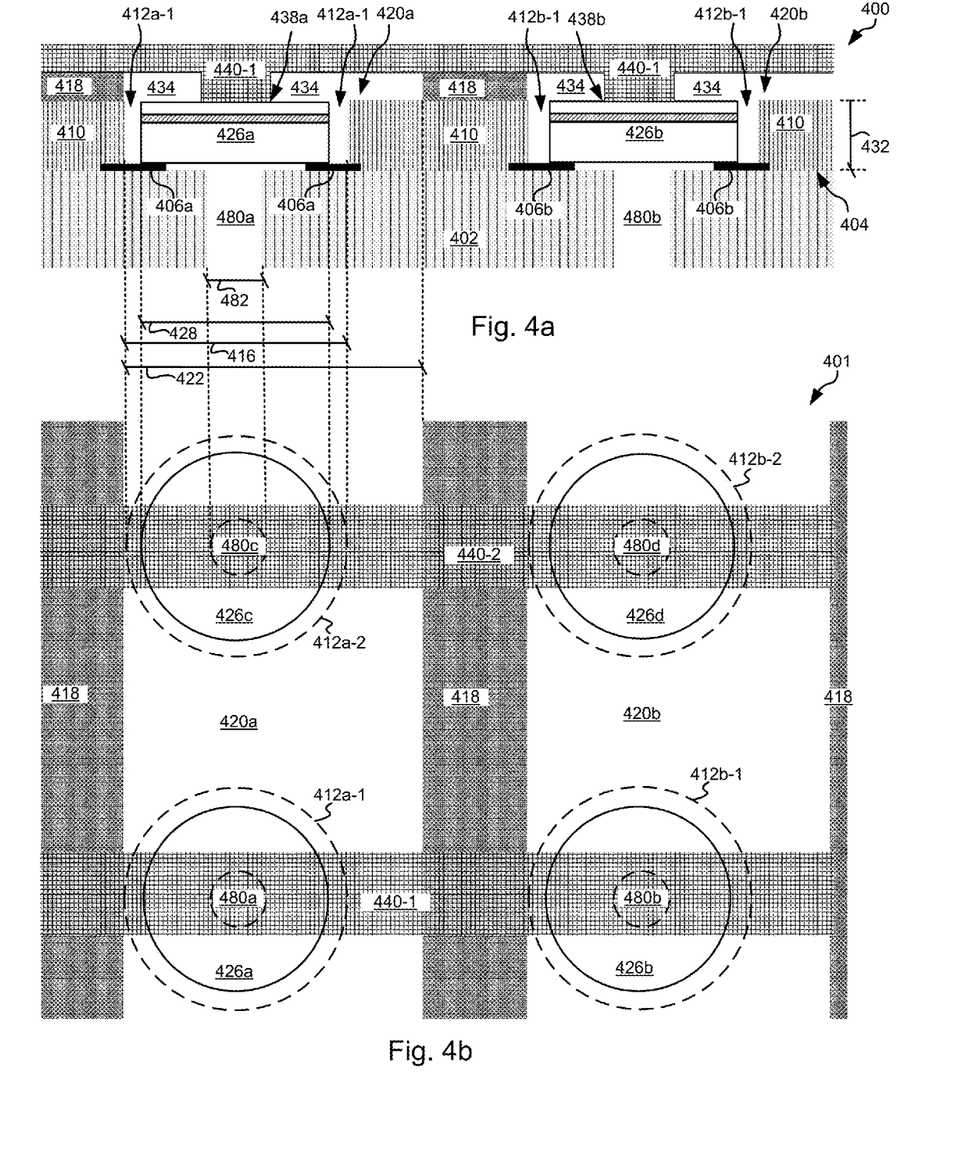
FIGS. 4a-4b show a portion of yet another panel including wells into which diode objects are deposited where each of the wells includes a through-hole via, and steering structures in accordance with various embodiments of the present inventions.

Turning to FIGS. 4a-4b, a cross-sectional view 400 and a top view 401 of a portion of a panel including wells 412 into which diode objects 426 (e.g., Light Emitting Diodes) are deposited, through-hole vias 480 extending through a substrate 402 from the bottom of each of wells 412, and off-center steering structures 420 is shown in accordance with some embodiments of the present inventions. It should be noted that while wells 412 are shown off-center from steering structures 420, that they may be centered similar to that discussed above in relation to FIGS. 2a-2c. As shown, the panel includes substrate 402 with a planar top surface 404 and interconnect pads 406 aligned in a plurality of rows. Substrate 402 may be a transparent material such as glass, quartz, or a plastic. While FIGS. 4a-4b show only two columns and two rows incorporating four wells 412, a number of rows (indicated by the small case letter following the element identifying numbers (e.g., 420a, where the "a" indicates the row)) and columns (indicated by the dash number following the element identifying numbers (e.g., 440-1, where the "'1" indicates the column)) can be used to form a panel.

A first film 410 is disposed over top surface 404 of substrate 402, and wells 412 are defined in first film 410. Each well 412 is aligned in a corresponding row (again, indicated by the small case letter following the element identifying numbers) and column (again, indicated by the dash number following the element identifying numbers). Each well 412 has a cross-sectional opening 416 that exposes a corresponding interconnect pad 406. As one particular example, well 412a-1 exposes interconnected pad 406a. In this embodiment, cross-sectional opening 416 is depicted as circular, but alternatively it may be square, rectangular, oval, or have a counterbore pocket structure. First film 410 may be formed using any process known in the art for forming a layer with wells. As just one example, first film 410 may be formed using a conformal deposition and selective etching process. Based upon the disclosure provided herein, one of ordinary skill in the art will recognize a variety of processes that may be used to form first film 410 in accordance with different embodiments. A cross-sectional opening 482 of through-hole via 480 is less than cross-sectional opening 416. In some embodiments, cross-sectional opening 482 is thirty (30) microns. Based upon the disclosure provided herein, one of ordinary skill in the art will appreciate other widths for first through-hole vias 480 in accordance with different embodiments.

A second film 418 is disposed over first film 410. Second film 418 includes plurality of parallel steering structures 420. Each steering structure 420 has a width 422 that is greater than cross-sectional opening 416 of wells 412 and surrounds a number of wells (e.g., steering structure 420a surrounds wells 412a-1 and 412a-2; and steering structure 420b surrounds wells 412b-1 and 412b-2) such that the surrounded wells are exposed within the respective steering structure 420. In some embodiments, second film 418 is a removable material that can be removed prior to deploying the final assembled panel. In other embodiments, second film 418 is not removed prior to deploying the final assembled panel. In some embodiments, second film 418 is a different material than that of first film 410. In other embodiments, second film 418 is the same material as that of first film 410. In this embodiment, wells 412 off-center within steering structures 220 such that: a small portion of the perimeters of wells 412a-1 and 412a-2 are coextensive with a sidewall 490 of second film 418, but a sidewall 491 of second film 418 is not coextensive with any portion of the perimeters of wells 412a-1 and 412a-2; and a small portion of the perimeters of wells 412b-1 and 412b-2 are coextensive with a sidewall 492 of second film 418, but a sidewall 493 of second film 418 is not coextensive with any portion of the perimeters of wells 412b-1 and 412b-2. Second film 418 may be formed using any process known in the art for forming a layer with steering structures. As just one example, second film 418 may be formed using a conformal deposition and selective etching process. Based upon the disclosure provided herein, one of ordinary skill in the art will recognize a variety of processes that may be used to form second film 418 in accordance with different embodiments.

Diode objects 426 are deposited into wells such that a bottom contact on each of diode objects are electrically connected to interconnect pads 406 exposed by wells 412. A plurality of top electrically conductive traces 440 are disposed over a column of wells 412 such that an electrical connection at a top contact 438 of each of the diode objects 426 within a given column is made. An insulator material 434 is formed around each of the diode objects 426 within their respective well 412. As would be known in the art, diode objects 426 may include a lower material with either a p-dopant or an n-dopant and an upper material of the opposite dopant type, with an intervening multiple quantum well (MQW). The MQW may be a series of quantum well shells (typically 5 layers—e.g., alternating 5 nanometer (nm) of indium gallium nitride (InGaN) with 9 nm of n-doped GaN (n-GaN)). There may also be an aluminum gallium nitride (AlGaN) electron blocking layer between MQW layers and the p-doped disk. The outer shell may be p-doped GaN (Mg doping) about 400 nm thick. A high-brightness blue LED can be formed, or a green LED if a higher indium content is used in the MQW. The lower material may be a material such as p-GaN, p-doped aluminum gallium indium phosphide (p-AlGaInP), n-GaN, or n-AlGaInP. The upper material may be the same as the lower material, but oppositely doped. It should be noted that the aforementioned discussion of materials and structure of diode objects 426 is not exhaustive, and that one of ordinary skill in the art will recognize other materials and structures that may be used in relation to different embodiments.

In some embodiments, first film 410 has a first thickness 432 and diode objects 426 exhibit a similar thickness. In some cases, the difference between the thickness of diode object 426 and thickness 432 is less than fifty (50) percent of the overall thickness of diode object 426.

Figure 5:
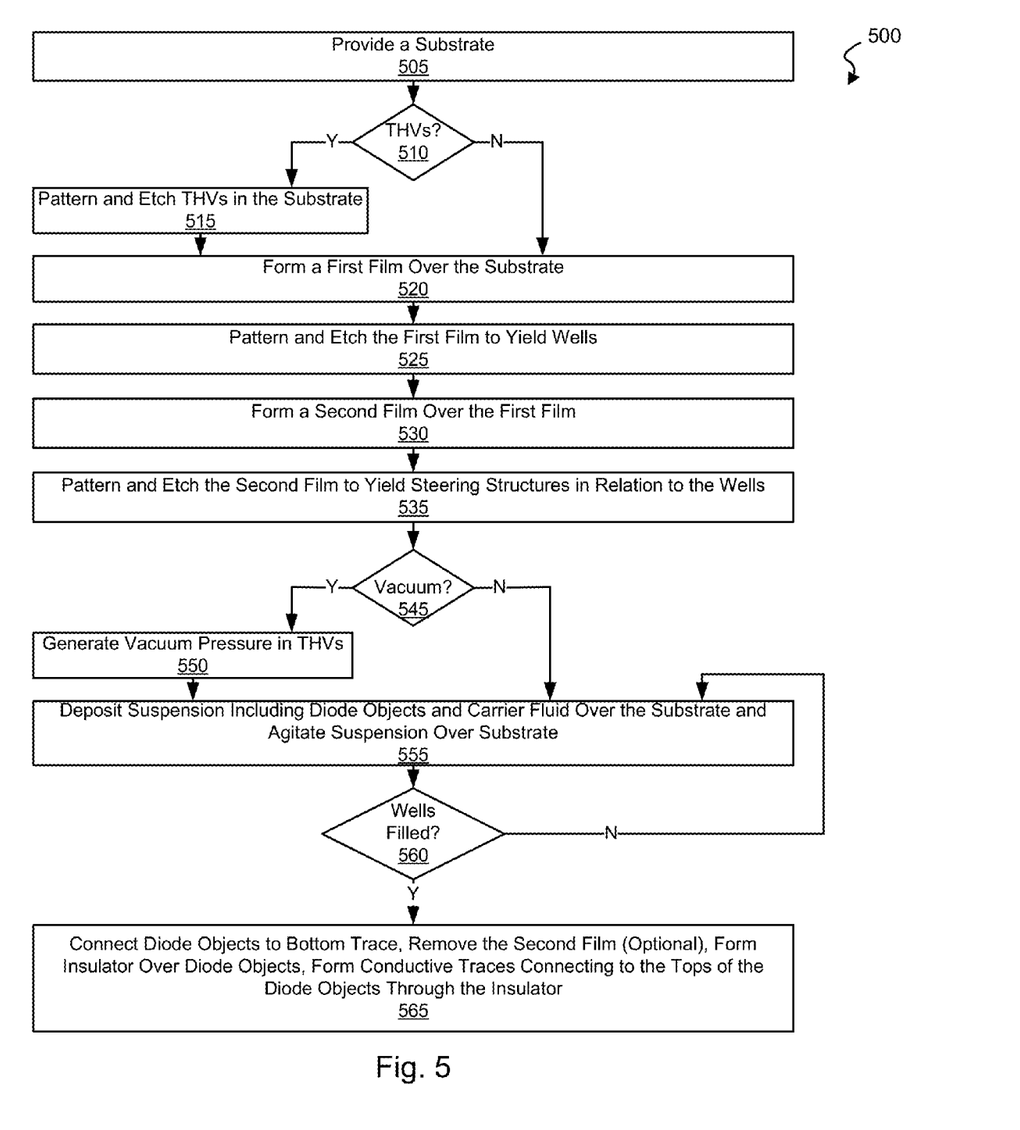
FIG. 5 is a flow diagram depicting a method in accordance with one or more embodiments of the present inventions for assembling diode objects into a panel.
Figure 6A:
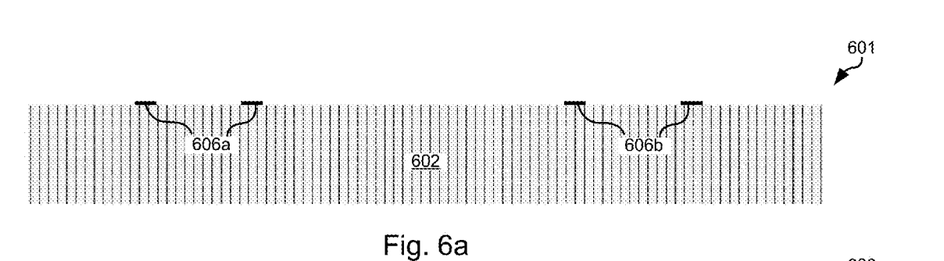
FIGS. 6a-6g show a series of processes for assembling diode objects into a panel in accordance with one or more embodiments of the present inventions.

Turning to FIG. 5, a flow diagram 500 depicts a method in accordance with one or more embodiments of the present inventions for assembling diode objects into a panel. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Following flow diagram 500, a substrate is provided that includes a substantially planar top surface with interconnect pads aligned in a plurality of rows (block 505). Turning to FIG. 6a, a cross-sectional view 601 of a portion of a substrate 602 including interconnect pads 606 is shown to illustrate the process of block 505 of FIG. 5 with rows being designated "a" and "b". Bottom trace interconnect (not shown) is also formed on top of sustrate 602 to connect various of interconnect pads 606.

Figure 6B:
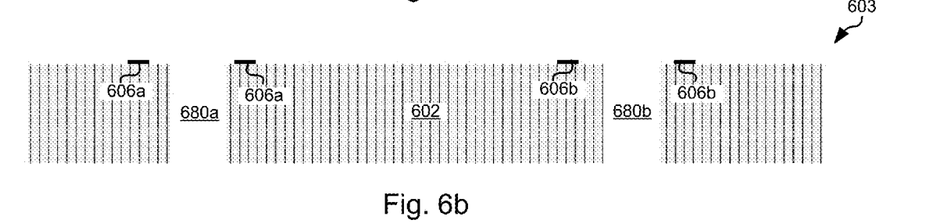
Figure 6C:
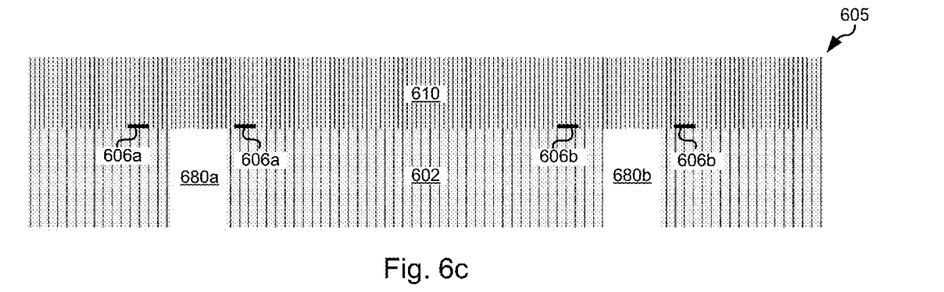
Figure 6D:
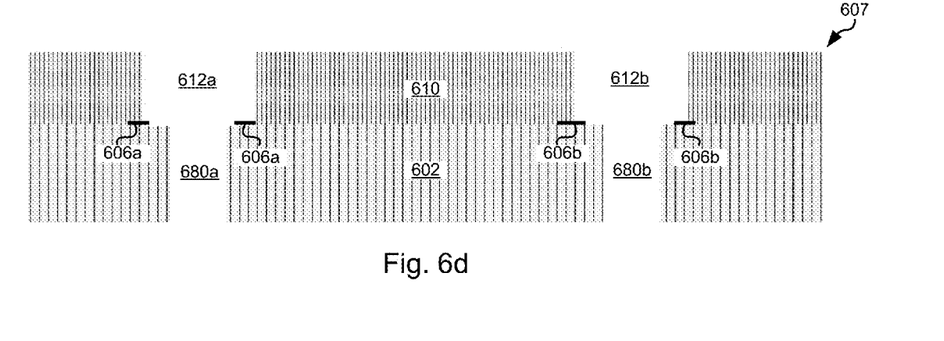

Returning to FIG. 5, it is determined whether THVs are to be formed in the substrate (block 510). Where THVs are to be formed (block 510), THVs are patterned and etched in the substrate (block 515). Turning to FIG. 6b, a cross-sectional view 603 of a portion of a substrate 602 including interconnect pads 606 is shown with THVs 680 extending though substrate 602 to illustrate the process of block 515 of FIG. 5. Returning to FIG. 5, a first film is formed over the substrate (block 520). This may be done using any process known in the art for depositing a material on top of a substrate. Turning to FIG. 6c, a cross-sectional view 605 of a portion of a substrate 602 having a first film 610 formed thereon is shown to illustrate the process of block 520 of FIG. 5. Returning to FIG. 5, the first film is patterned and etched to form wells exposing interconnect pads 606 and through-hole vias 680 (block 525). Turning to FIG. 6d, a cross-sectional view 607 of a portion of a substrate 602 including wells 612 exposing interconnect pads 606 is shown to illustrate the process of block 525 of FIG. 5. Each well 612 has a cross-sectional opening, and is aligned in a corresponding row and column.

Figure 6E:
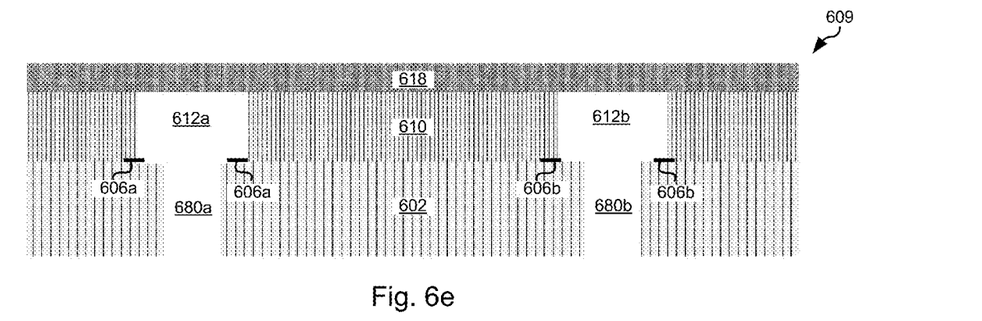
Figure 6F:
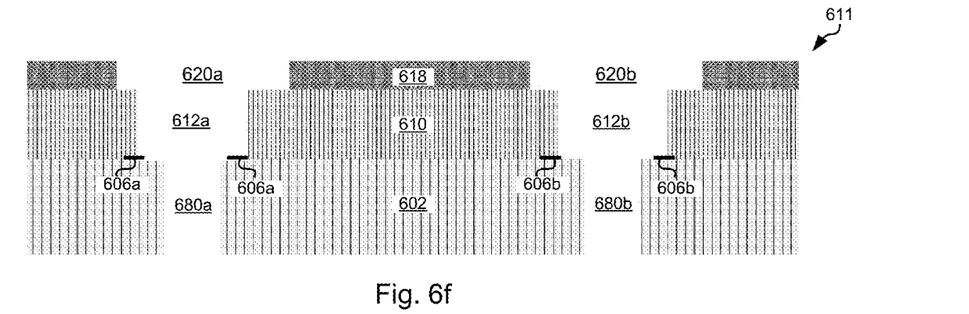

Returning to FIG. 5, a second film is formed over the first film (block 530). This may be done using any process known in the art for depositing a material on top of a substrate. Turning to FIG. 6e, a cross-sectional view 609 of a portion of a substrate 602 having a second film 618 formed over first film 610 is shown to illustrate the process of block 530 of FIG. 5. Returning to FIG. 5, the second film is patterned and etched to form steering structures in relation to wells 612 (block 535). Each steering structure has a width greater than the well cross-sectional opening, and exposes a corresponding column of wells. Turning to FIG. 6f, a cross-sectional view 611 of a portion of a substrate 602 including steering structures 620 surrounding a corresponding column of wells 612 is shown to illustrate the process of block 535 of FIG. 5. Each well 612 has a cross-sectional opening, and is aligned in a corresponding row and column.

Figure 6G:
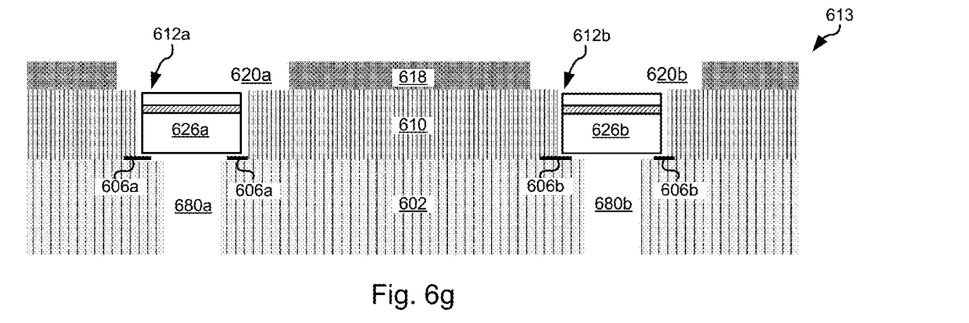

Returning to FIG. 5, it is determined whether vacuum pressure is to be employed in relation to depositing diode objects into the wells (block 545). Where vacuum pressure is to be used (block 545), a vacuum pressure is produced under the substrate such that carrier fluid in a suspension flowing over the surface will be drawn through through-hole vias and tend to cause diode objects suspended in the carrier fluid to be drawn into corresponding wells (block 550). A suspension including the diode objects suspended in the carrier fluid is deposited on the surface, and is agitated such that the diode objects deposit into the wells (block 555). Where all wells are not yet filled with a diode object (block 560), the process of block 555 continues. Otherwise, where all wells are filled (block 560), the diode objects are connected to the bottom trace, the second film may be removed, an insulator is formed over the diode objects and conductive traces formed through the insulator to connect the diode objects (block 565). Turning to FIG. 6g, a cross-sectional view 613 of a portion of a substrate 602 including wells 612 filled with diode object 626 is shown to illustrate the process stage preceding block 565 of FIG. 5.

In conclusion, the invention provides novel systems, devices, methods and arrangements for fluidic assembly. While detailed descriptions of one or more embodiments of the invention have been given above, various alternatives, modifications, and equivalents will be apparent to those skilled in the art without varying from the spirit of the invention. For examples, while some embodiments are discussed in relation to displays, it is noted that the embodiments find applicability to devices other than displays. As another example, while steering structures are shown as open on the top, in some cases they may be enclosed to make a fluidic flow chamber. Therefore, the above description should not be taken as limiting the scope of the invention, which is defined by the appended claims.

What is claimed is:

1. A method for forming a fluidic assembly direct-emission display panel, the method comprising:
providing a substrate with a planar top surface and interconnect pads aligned in a plurality of parallel rows;
forming a first film overlying the substrate top surface;
forming a plurality of wells in the first film, each well having a cross-sectional opening, and aligned in a corresponding row and column, exposing a corresponding interconnect pad;
forming a second film overlying the first film; and
forming a plurality of parallel slots in the second film, where each slot has a width greater than the well cross-sectional opening, exposing a corresponding column of wells.

2. The method of claim 1, wherein forming the wells in the first film includes forming wells with a perimeter; and wherein forming the slots in the second film includes forming through-indentations in a sidewall of each slot, with the through-indentations exposing at least a portion of each well perimeter.

3. The method of claim 1, the method further comprising:
flowing an ink comprising a solvent and a plurality of light emitting diode (LED) disks, where each LED disk has a disk diameter less than the well cross-sectional opening, and a bottom surface with a lower contact;
channeling the ink into the plurality of slots;
capturing the LED disks in the wells; and
making contact between the lower contact of each LED disk and a corresponding bottom trace.

4. The method of claim 1, wherein forming the first film includes forming the first film with a first thickness; wherein flowing the ink includes flowing an ink comprising LED disks having about the first thickness; and the method further comprising:
subsequent to capturing the LED disks in the wells, forming an insulating material to isolate LED disk sidewalls from subsequently formed top conductive traces, with vias exposing LED disk top contacts; and
forming a plurality of top electrically conductive traces overlying the insulator material and connected the top contact of a column of LED disks.

5. The method of claim 1, the method further comprising:
subsequent to capturing the LED disks in the wells, removing the second film.

6. The method of claim 1, the method further comprising:
prior to forming the first film, forming through-hole vias (THVs) co-located with each interconnect pad.

7. The method of claim 1, the method further comprising:
prior to forming the first film, forming through-hole vias (THVs) co-located with each interconnect pad, each THV having a THV diameter less than the LED disk diameter;
simultaneous with flowing the ink, creating vacuum pressure through the THVs; and,
wherein capturing the LED disks in the wells includes capturing the LED disks at least partially in response to the vacuum pressure.

* * * * *